US007005740B2

(12) United States Patent
Ammar

(10) Patent No.: US 7,005,740 B2
(45) Date of Patent: Feb. 28, 2006

(54) THICK FILM MILLIMETER WAVE TRANSCEIVER MODULE

(75) Inventor: Dan F. Ammar, Windermere, FL (US)

(73) Assignee: Xytrans, Inc., Orlando, FL (US)

( * ) Notice: Subject to any disclaimer, the term of this patent is extended or adjusted under 35 U.S.C. 154(b) by 0 days.

(21) Appl. No.: 10/850,224

(22) Filed: May 20, 2004

(65) Prior Publication Data

US 2004/0212084 A1 Oct. 28, 2004

Related U.S. Application Data

(63) Continuation of application No. 09/863,030, filed on May 22, 2001, now Pat. No. 6,759,743.

(60) Provisional application No. 60/231,926, filed on Sep. 11, 2000.

(51) Int. Cl.
 *H01L 23/32* (2006.01)
(52) U.S. Cl. .......................... 257/728; 257/678; 455/73
(58) Field of Classification Search ................ 257/277, 257/728, 664, 678; 333/26, 247; 342/27; 455/73
 See application file for complete search history.

(56) References Cited

U.S. PATENT DOCUMENTS

| | | | | |
|---|---|---|---|---|
| 4,453,142 A | 6/1984 | Murphy | .......................... | 333/26 |
| 5,049,978 A | 9/1991 | Bates et al. | .................... | 357/74 |
| 5,239,685 A | 8/1993 | Moe et al. | .................... | 455/73 |
| 5,254,941 A | 10/1993 | Osika | ........................ | 324/158 |
| 5,319,329 A | 6/1994 | Shiau et al. | ................ | 333/204 |
| 5,386,085 A | 1/1995 | Miehls et al. | .............. | 174/250 |
| 5,406,122 A | 4/1995 | Wong et al. | ................ | 257/753 |
| 5,423,080 A | 6/1995 | Perret et al. | .................... | 455/90 |
| 5,451,818 A | 9/1995 | Chan et al. | ................ | 257/728 |
| 5,545,924 A | 8/1996 | Contolatis et al. | .......... | 257/724 |
| 5,852,391 A | 12/1998 | Watanabe et al. | ........... | 333/246 |
| 5,982,250 A | 11/1999 | Hung et al. | .................... | 333/26 |
| 6,094,161 A * | 7/2000 | Cassen et al. | .............. | 342/175 |
| 6,114,986 A * | 9/2000 | Cassen et al. | .............. | 342/175 |
| 6,124,636 A | 9/2000 | Kusamitsu | .................... | 257/728 |
| 6,175,287 B1 | 1/2001 | Lampen et al. | ............. | 333/247 |
| 6,178,097 B1 * | 1/2001 | Hauk, Jr. | ..................... | 361/816 |
| 6,278,400 B1 * | 8/2001 | Cassen et al. | .............. | 342/175 |
| 6,426,686 B1 | 7/2002 | Douriet et al. | .............. | 333/247 |
| 6,501,415 B1 | 12/2002 | Viana et al. | .................. | 342/27 |

(Continued)

OTHER PUBLICATIONS

Lester et al., "Low Cost Miniaturized EHF SATCOM Transceiver Featuring HEMT MMICs and LTCC Multi-Layer Packaging", IEEE 1995 Microwave and Millimeter Wave Monolithic Circuits Symposium, May 15-16, 1995 (INSPEC Accession No.:5051293).*

(Continued)

*Primary Examiner*—Nathan J. Flynn
*Assistant Examiner*—Johannes Mondt
(74) *Attorney, Agent, or Firm*—Allen, Dyer, Doppelt, Milbrath & Gilchrist, P.A.

(57) ABSTRACT

A thick film millimeter wave transceiver module includes a base plate and a multi-layer substrate board having a plurality of layers of low temperature transfer tape received on the base plate. The different layers can vary. They can include a DC signals layer having signal tracks in connection; a ground layer having ground connections; a device layer having capacitors and resistors embedded therein; and a top layer having cut-outs for receiving MMIC chips therein. A solder preform layer is located between the device layer and the top layer for securing any MMIC chips. A channelization plate is received over the multi-layer substrate board and a channel is formed to receive MMIC chips and provide isolation between transmit and receive signals.

20 Claims, 5 Drawing Sheets

U.S. PATENT DOCUMENTS

2003/0043887 A1    3/2003    Hudson ...................... 375/144

OTHER PUBLICATIONS

Prabhu et al., "*Co-Fired Ceramic on Metal Multichip Modules For Advanced Military Packaging,*" Aerospace and Electronics Conference, Proceedings of the IEEE, May 24, 1993, pp. 217-222.

Jayaraj et al., "*RF Characterization of a Low Cost Multichip Packaging Technology For Monolithic Microwave and Millimeter Wave Integrated Circuits,*" 1995 URSI International Symposium on San Francisco, IEEE, Oct. 25, 1995, pp. 443-446.

Gutierrez et al., "*A Thick Film Package for Microwave ICs,*" Proceedings of the Electronic Components and Technology Conference, IEEE, May 18, 1992, pp. 151-156.

\* cited by examiner

THICK FILM MILLIMETER WAVE TRANSCEIVER MODULE

RELATED APPLICATION

This application is a continuation of Ser. No. 09/863,030 filed May 22, 2001, now U.S. Pat. No. 6,759,743, which is based on provisional patent application Ser. No. 60/231,926 filed Sep. 11, 2000, the disclosures of which are hereby incorporated by reference in their entirety.

FIELD OF THE INVENTION

This invention relates to microwave monolithic integrated circuits (MMIC), and more particularly, this invention relates to modules having a microwave monolithic integrated circuit that can be tuned for optimum performance and improved packaging of a MMIC and transceiver module.

BACKGROUND OF THE INVENTION

The recent explosion in wireless telecommunications has increased the demand for high performance millimeter wave radio frequency (RF) modules. One of the major cost and yield drivers for high frequency MMIC modules has been manual tuning to optimize module performance. The majority of MMIC RF amplifiers are not self biased. Therefore, each amplifier requires gate voltage (Vg) adjustment to tune the amplifier to its nominal operating conditions. This tuning normally occurs after the amplifiers have been assembled in the module and are connected to the power supply.

In order to have access to the chips in the module, probe stations are required. In addition, highly skilled operators are necessary to probe these small devices under a microscope. Damage to the chips is very common, even with veteran MMIC technicians. The needle-like probes used in the tuning cost thousands of dollars, and usually have a limited life because of wear and tear. It is estimated that it takes 20 to 30 minutes to probe each amplifier.

Many attempts have been made to automate the probing process, and there has been some limited success. The time and cost, however, involved in designing and using automatic module probing is extensive. In most cases, unique module designs prevent the use of a particular automatic probe station for more than a single module. These drawbacks have presented a challenge to many companies active in designing and manufacturing RF modules. As a result, high frequency modules are not produced in high volume. In most cases, manufacturers are forced to use expensive equipment and a large staff of qualified technicians to manufacture large numbers of RF modules.

Chip packaging for MMIC chips also is increasingly important. MMIC radio frequency modules have never been manufactured in high quantity amounts because the MMIC chips are fragile, typically 2 to about 4 mil thick, and difficult to handle. Air bridges, located over the surface of the chips, make it difficult to pick the chips from the top or exert pressure on the chips.

Special pick-up tools with pick-in-place equipment have been used to automatically pick-in-place the MMIC chips. These tools are expensive to manufacture and usually different MMIC chips require different tools. This has presented a challenge to different manufacturing companies because most automatic pick-in-place machines are limited to a limited number of tools for MMIC chips. In some cases, a manufacturer must use a series of different pick-in-place machines to assemble one radio frequency module. This is inefficient.

These MMIC radio frequency modules also are built in low volume amounts because there are usually a high number of MMIC chips, substrates and peripherals that are installed in each module. For example, a typical millimeter wave transceiver would have about 10 to about 15 MMIC chips, 15–20 pieces of substrate, and about 50–60 other peripheral components, such as resistors and capacitors. There is also a requirement that each of the components be connected via wire or ribbon bonds. This has also presented the challenge to millimeter wave module manufacturing companies.

SUMMARY OF THE INVENTION

A thick film millimeter wave transceiver module includes a base plate. A multi-layer substrate board has a plurality of layers of low temperature transfer tape received on the base plate. The layers comprise at least one of a DC signals layer having signal tracks and connections, a ground layer having ground connections, a device layer having capacitors and resistors embedded therein, and a top layer having cut-outs for receiving MMIC chips therein. A solder preform layer is located between the device layer and the top layer for securing any MMIC chips. A channelization plate is received over the multi-layer substrate board and has channels formed to receive MMIC chips and provide isolation between transmit and receive signals.

In yet another aspect of the present invention, the module can include isolation vias, which extend through multiple layers down to the ground layer. A radio frequency cover is received over the channelization plate. Each of the layers within the multi-layer substrate board can be about 2 to about 4 mil thick. Typically the layers are about 3 mil thick and the top layer is about 4 mil thick. The base plate can be formed from one of copper tungsten or other CTE matched material. The base plate is about 0.1 to about 0.3 inches thick. In yet another aspect of the present invention, the base plate is about 0.125 inches thick.

A method is also disclosed and comprises forming a thick film millimeter wave transceiver module by forming a base plate and forming a multi-layer substrate board having a plurality of layers of low temperature transfer tape. The substrate board is received on the base plate and comprises one of at least a DC signals layer having signal tracks and connections; a ground layer having ground connections; a device layer having capacitors and resistors embedded therein; and a top layer having cut-outs for receiving MMIC chips therein. The MMIC chip is secured by solder.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

The present invention advantageously eliminates manual amplifier probing and module tuning in MMIC module manufacturing. By using low cost surface mount devices and a microprocessor, the RF module performance can be optimized in real time with no intervention for use in communications, radar, fiber optic, and other RF applications. The advantages include:

1. Optimization of RF MMIC amplifier operation without manual or automatic probing or tuning.
2. A simple low cost solution (<$1) per amplifier that eliminates module probing and tuning.
3. Self-tuning that requires no die probing or testing.
4. Reduced RF module assembly and test at least by a factor of 5.
5. Chip level self diagnostics.
6. Transmitter gain and output power control without using attenuator chips.
7. Temperature compensation without the use of active attenuator.
8. Reducing/controlling the DC power dissipation as a function of output power, therefore controlling thermal conditions.
9. Testing RF power through the use of a power monitor circuit.
10. Using an embedded microprocessor for continuous real-time optimization of module performance.
11. User optimization of key module performance parameters without circuit design changes.
12. Shutting down the transmitter RF output (sleep mode) for safety without switching off the power supply.
13. Upgrading module performance via module software upgrade, i.e., a customer pays only for needed features.
14. Correcting for parts variation as a function of temperature and frequency using the on board EEPROM to store characteristics data.

Figure 1:
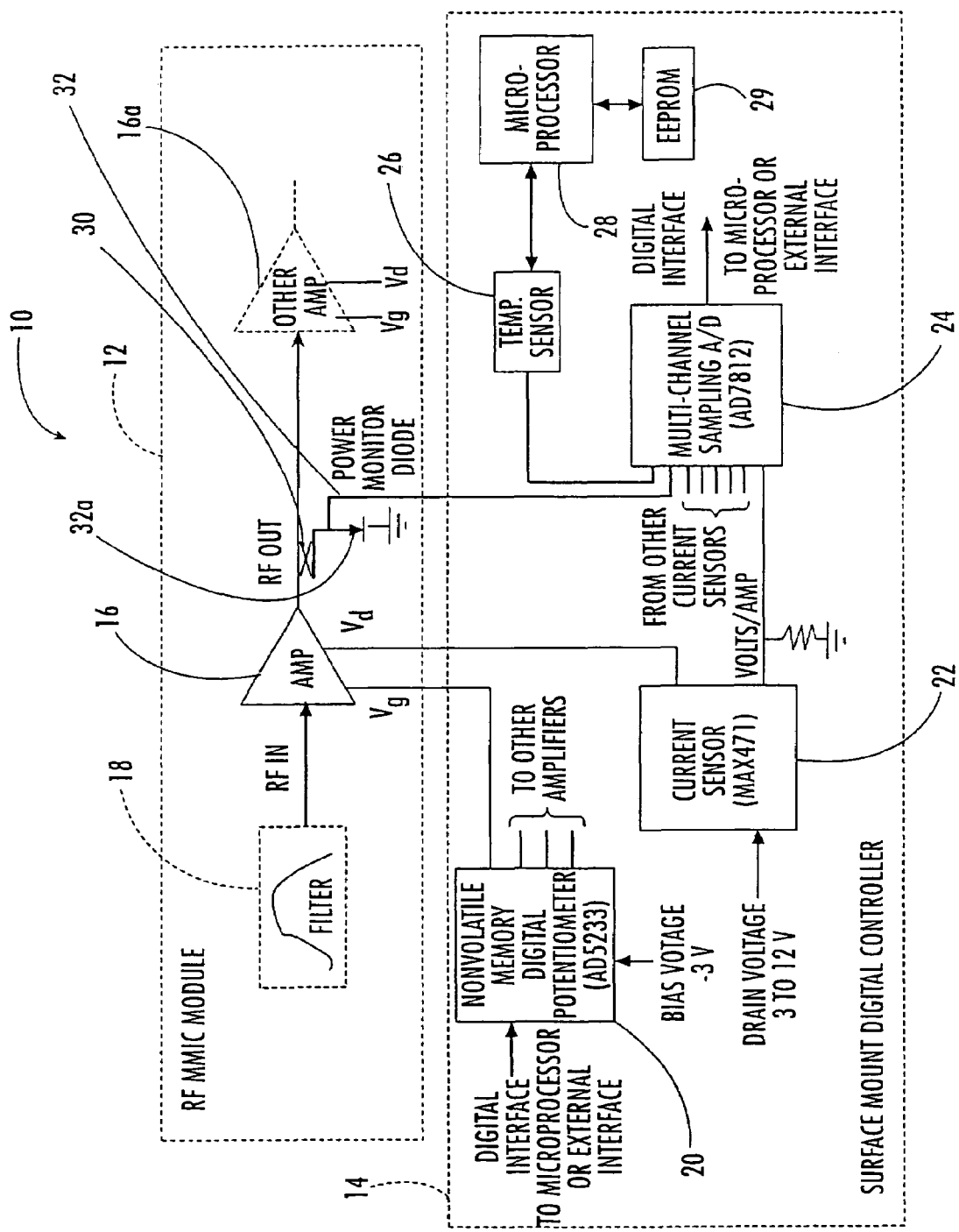
FIG. 1 is a schematic circuit diagram of a self-tuned millimeter wave transceiver module of the present invention.

FIG. 1 illustrates the low cost circuit used to self bias the MMIC amplifiers. The entire circuit is implemented using low cost commercial off the shelf (COTS) surface mount chips.

As illustrated, a schematic circuit diagram of the self-tuned millimeter wave transceiver module 10 of the present invention is shown. The module 10 includes a radio frequency MMIC chip formed as a module and illustrated by the dashed lines at 12 and a surface mounted digital microcontroller, indicated by the dashed lines at 14.

The MMIC module includes a plurality of amplifiers, as is typical with a MMIC chip, but only illustrates one amplifier 16. The radio frequency signal enters and passes through a filter 18 and into the amplifier 18 having the normal gate, source and drain. The radio frequency signal passes from the amplifier 16 into other amplifiers 16a (if present), as known to those skilled in the art. The MMIC chip 12 can include a large number of amplifiers 16 on one chip, as known to those skilled in the art. The surface mounted digital controller 14 includes a digital potentiometer 20 having a nonvolatile memory circuit. An example of a potentiometer includes a AD5233 circuit, as known to those skilled in the art. The potentiometer 20 can handle a bias voltage of about −3 volts.

A current sensor 22, such as a MAX471 with a drain voltage of 3–12 volts, is coupled to ground and to the amplifier 16 through the drain. The current sensor 22 is connected to a multi-channel sampling, analog/digital circuit 24, such as an AD7812 circuit, as known to those skilled in the art. Other current sensors connect to other amplifiers (not shown) and connect to the multi-channel A/D circuit 24. A temperature sensor 26 is connected to the multi-channel sampling A/D circuit and is operative for measuring the temperature of the MMIC module. A microprocessor 28 is included as part of the surface mounted digital controller, and operatively connected to an EEPROM 29 and other components, including the multi-channel sampling A/D circuit 24 and the nonvolatile memory digital potentiometer 20. As shown, the potentiometer 20 is connected to other amplifiers on the MMIC and can step gate voltage for respective amplifiers and provide individual control.

As also illustrated, the radio frequency signal from the amplifier 16 can pass from passive coupler 30 to a power monitor diode or other detector circuit 32 connected to ground. This connection from passive coupler 30 can be forwarded to the multi-channel sampling A/D circuit 24.

The circuit shown in FIG. 1 adjusts automatically the amplifier gate voltage (Vg) until the amplifier 16 reaches its optimum operating condition as measured by the amount of current drawn by the drain (Id), and as measured by the detector circuit 32 at the output of the amplifier (if available). This is achieved by controlling (through a serial digital interface) the Digital-to-analog (D/A) converter output voltage generated from potentiometer 20. The D/A converter includes a nonvolatile memory and is currently available with four channels for less than $3 at the current time.

As the gate voltage is varied, the current sensor 22 provides a voltage output that is proportional to the drain current drawn by the amplifier 16. The current sensor output is digitized by the multi-channel serial analog-to-digital converter (A/D) 24 that digitizes the drain current level. The current level word is compared to a pre-stored optimum amplifier drain current level, such as contained in the EEPROM 29. The gate bias level is adjusted until the optimum drain current is reached. The detector circuit, which is available either on the MMIC chip or could be added externally, provides a confirmation that the drain current setting is at the optimum level by measuring the output power. The detector output 32 is compared to a pre-stored value that defines the expected nominal value at the output of the amplifier.

The drain current adjustment, the current sensing and detector output measurements can be implemented in a real-time continuous adjustment mode by using low cost microprocessor or through a one-time setting that is accomplished during module test. The EEPROM 29 can be used to store preset chip characteristics, such as optimum drain current and expected output at various stages in the RF circuit.

The current measurement sensor 22 also allows for diagnostics of each amplifier in the circuit. The current measurement circuit will sense any unexpected drop or increase in current draw. By monitoring the temperature sensor 26, the microprocessor 28 determines whether a change in current (Id) is caused by a temperature change or malfunction. The status of each amplifier 16 is reported via the digital serial interface.

In cases where DC power dissipation is a prime concern because of thermal issues, any amplifiers 16 can be adjusted via the gate bias control such that the amplifiers draw minimal current. A user may select a maximum temperature, and the microprocessor will maintain the transceiver at or below that temperature by controlling the DC power dissipation in the MMIC chips.

Traditional methods of controlling gain and output power in RF modules has been to use active attenuators in the transmit chain. This is inefficient because any amplifiers in the chain will dissipate power. By using the digital potentiometer 20, the gain and output power of-each amplifier can be controlled individually or in groups. The present invention allows the module to have infinite control over gain and output power, without adding active attenuators after each amplifier, thus, reducing cost and eliminating unnecessary DC power dissipation.

RF power sensing can be achieved through the power monitor diode and detector circuit 32 by coupling some of the amplifier output power (15 to 20 dB) into the passive coupler 30. The output of the coupler is sensed by a diode 32a. The output of the diode 32a is amplified and digitized via the serial A/D converter.

The digital potentiometer 20, current sensor 22 for each amplifier, and the temperature sensor 26 allows the module to self adjust its gain as a function of temperature changes. This is accomplished by maintaining the pre-set current draw from each amplifier constant as the module temperature changes. With the present invention, the module gain and output power can be controlled with high precision.

A user's ability to program the module gain at any stage in the circuit chain provides the flexibility to trade-off key performance parameters, such as transmitter noise figure (NF) versus intermodulation level (IM), without changing the circuit design. Real-time individual chip control also allows the user to operate in a desired condition, such as a linear mode for high modulation communications.

It should be understood that the self-optimization technique of the present invention can also be used on different devices with the MMIC chip, such as a mixer, multipliers, and an attenuator. By pinching off (maximum negative gate bias), all amplifiers in the transmit chain can be highly attenuated (over 50 dB) for safety reasons during installation. The present invention requires no additional switches or hardware.

The use of the microprocessor 28 and the chip control circuits as explained above allows the module manufacturer to enable only those features that a customer desires for a particular application. Although the module hardware is identical, the module features will be controlled by software. This allows flexibility of using the same module in many different applications, including wireless point-to-point, point to multi-point or Vsat. Additionally, the use of the microprocessor and a standard interfaces allows programmability and software upgrades (for additional features) of the modules in the field without removing them.

The use of a microcontroller 14 with the associated microprocessor 28 and onboard EEPROM 29 allow for correction and tuning of various functions within the module. The corrections may include, but are not limited to (a) gain variation over temperature, (b) linearization of the power monitor circuit as a function of temperature and frequency, (c) gain equalization as a function of frequency, and (d) power attenuation linearization as a function of frequency and temperature. The use of a microprocessor 28 to control each of the active devices with the RF module, and the use of the EEPROM 29 to store correction factors, allow a high degree of flexibility and enables the module to operate with high accuracy and performance. Module characterization data (gain, power, noise figure) are collected over temperature and frequency during module testing. The correction factors are calculated automatically by a Test Station and stored in the EEPROM 29. The correction factors are used during normal module operation to provide a desired performance.

Figure 2:
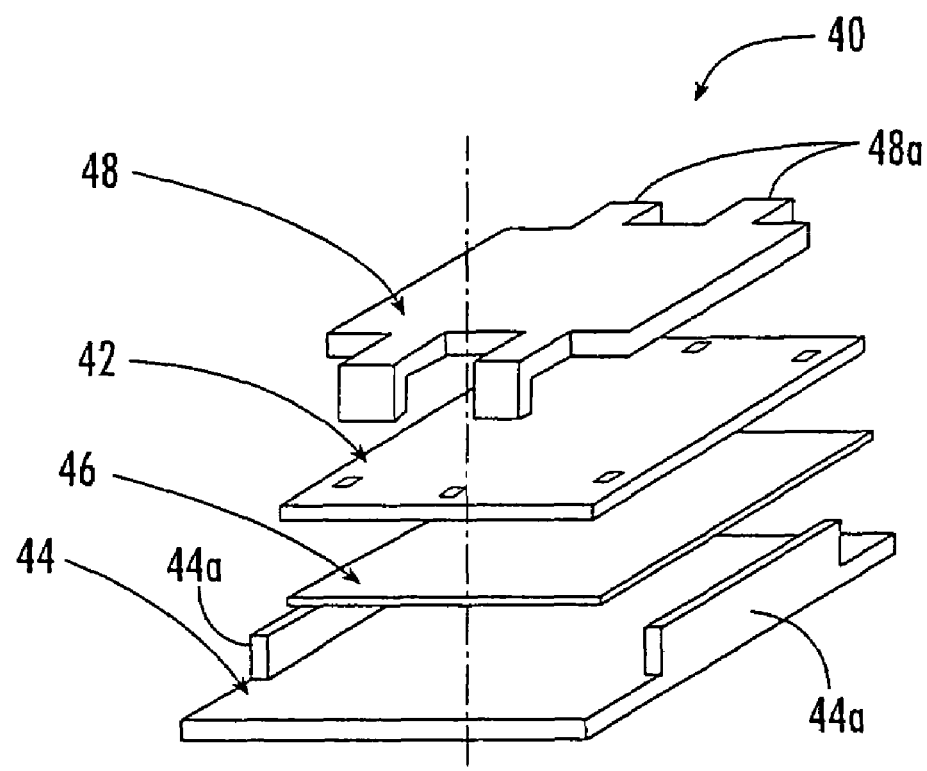
FIG. 2 is an exploded isometric view of a microwave monolithic integrated circuit (MMIC) package of the present invention.
Figure 2A:
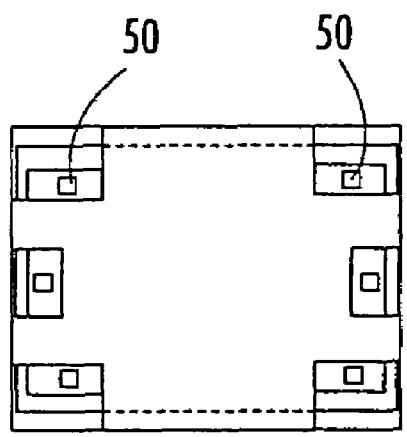
FIG. 2A is a plan view of the MMIC package shown in FIG. 2.
Figure 2B:
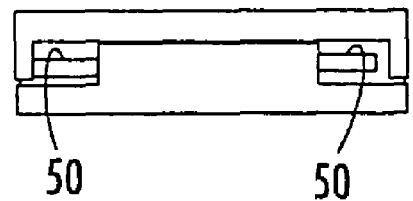
FIG. 2B is a side election view of the MMIC package shown in FIG. 2.

The present invention also provides an improved MMIC chip package as shown in FIGS. 2, 2A and 2B. The MMIC package 40 has several advantages.

1. Protection of MMIC chips in coefficient of thermal expansion (CTE) matched packages.

2. Packaging of MMIC chips at very low cost.

3. Improved auto pick and placement, direct wire bonding and ribbon bonding, without causing damage to a fragile MMIC.

4. Improved chip performance (isolation) through miniature packaging.

5. An RF module housing formed of low cost material, such as aluminum.

FIG. 2 illustrates an exploded isometric view of the package 40, and showing the MMIC chip 42 and a base plate 44 that is matched as to its coefficient of thermal expansion (CTE) with the MMIC. A solder preform 46 is contained on the base plate 44 and the MMIC is mounted on the solder preform 46. A chip cover 48 covers the MMIC. As shown, the base plate includes opposing side rails 44a that extend along a portion of formed edges to leave the end areas open. The chip cover 48 includes opposing and two spaced overlap legs 48a. The opposing side rails 44a and overlap legs 48a are configured such that when the chip cover is placed over the MMIC chip 42, solder preform 46 and CTE matched base plate 44, the side rails and overlap legs engage the respective chip cover and base plate, as shown in FIGS. 2A and 2B, to form open areas at the top and side of the corners and to leave exposed any pads 50 on the MMIC for wire and ribbon bonding thereto.

The MMIC module production can be similar to surface mount technology by packaging the MMIC chips to facilitate handling of the chips. The base plate 44 is formed of low cost Coefficient of Thermal Expansion (CTE) matched material, such as a copper tungsten alloy, CuW, or aluminum silicon alloy, ALSi, having a thickness of about 10–15 mil. The cover 48 can be made out of many types of material including plastic. A 1–2 mil solder preform (such as gold tin) is received on the base plate 44. The cover 48 is shaped in such a manner that it does not cover the chip input and output pads and the DC pads (gate and drain).

The base plate 44, the cover 48, the solder preform 46 and the MMIC chips 42 are delivered in waffle packs or similar packaging. These packages are placed on an automatic pick and place (P&P) machine, as known to those skilled in the art. The P&P machine is programmed to pick the base plate and place it in a waffle pack, which can be used at a high temperature for eutectic soldering (such as graphite), using temperature ranges known to those skilled in the art. The P&P machine picks and places the solder preform 46 into the base plate 44. The MMIC chip is placed on top of the solder preform 46. The cover is placed over the top of the chip 42. This process is repeated for every MMIC chip.

It is estimated that the total P&P per chip package would take about 10 seconds. The number of chips that can be packaged in a day using a single P&P machine is well over 8000. The entire waffle pack with the package assembly, including the MMIC chips, is placed in a eutectic solder oven to flow the solder and attach the chip to the base plate and attach the cover to the base plate.

Figure 3:
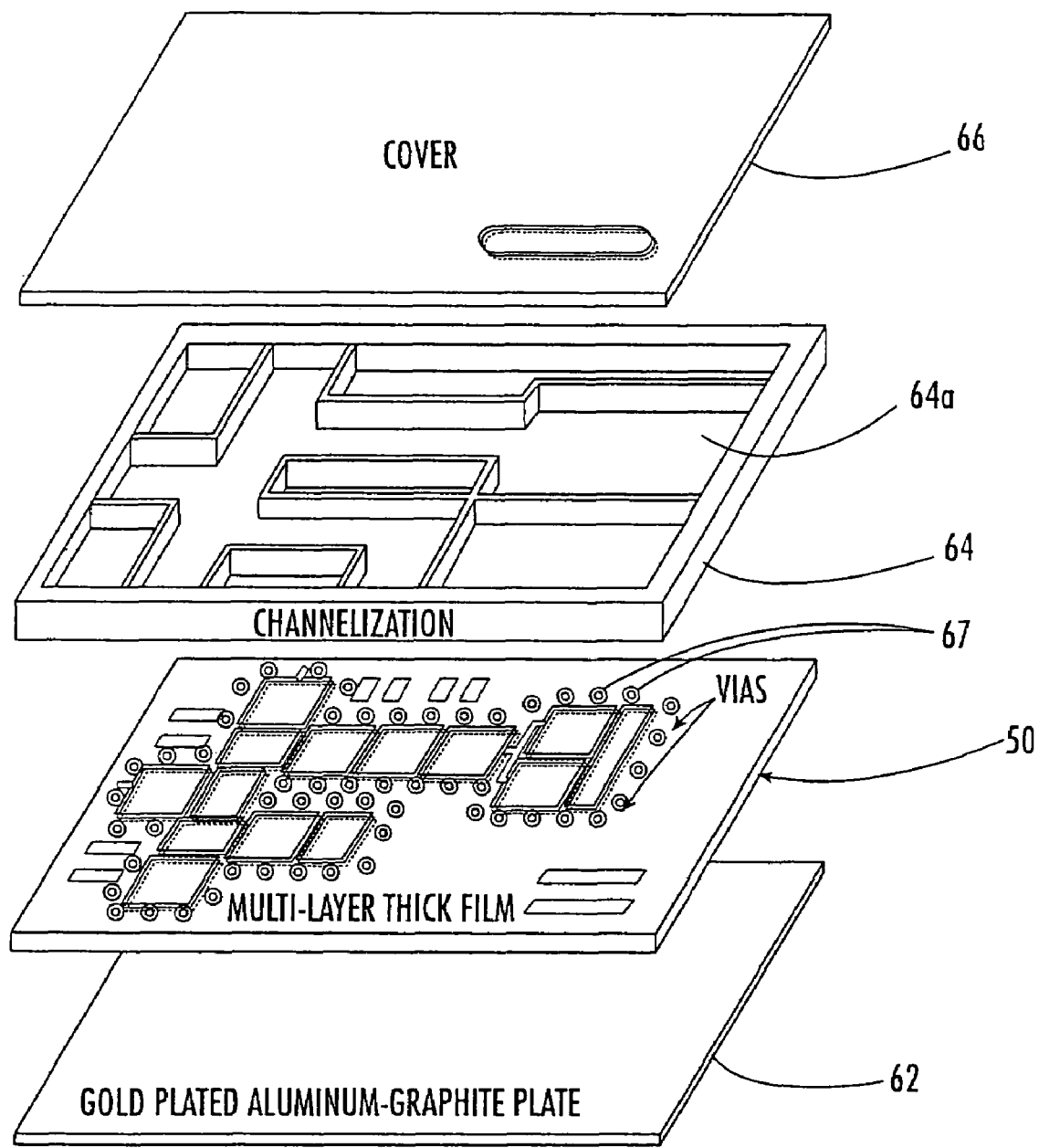
FIG. 3 is an exploded isometric view of a multi-layer, thick film, millimeter wave radio frequency transceiver module, and showing the cover, channelization section, multi-layer thick film section, and the bottom plate.
Figure 4:
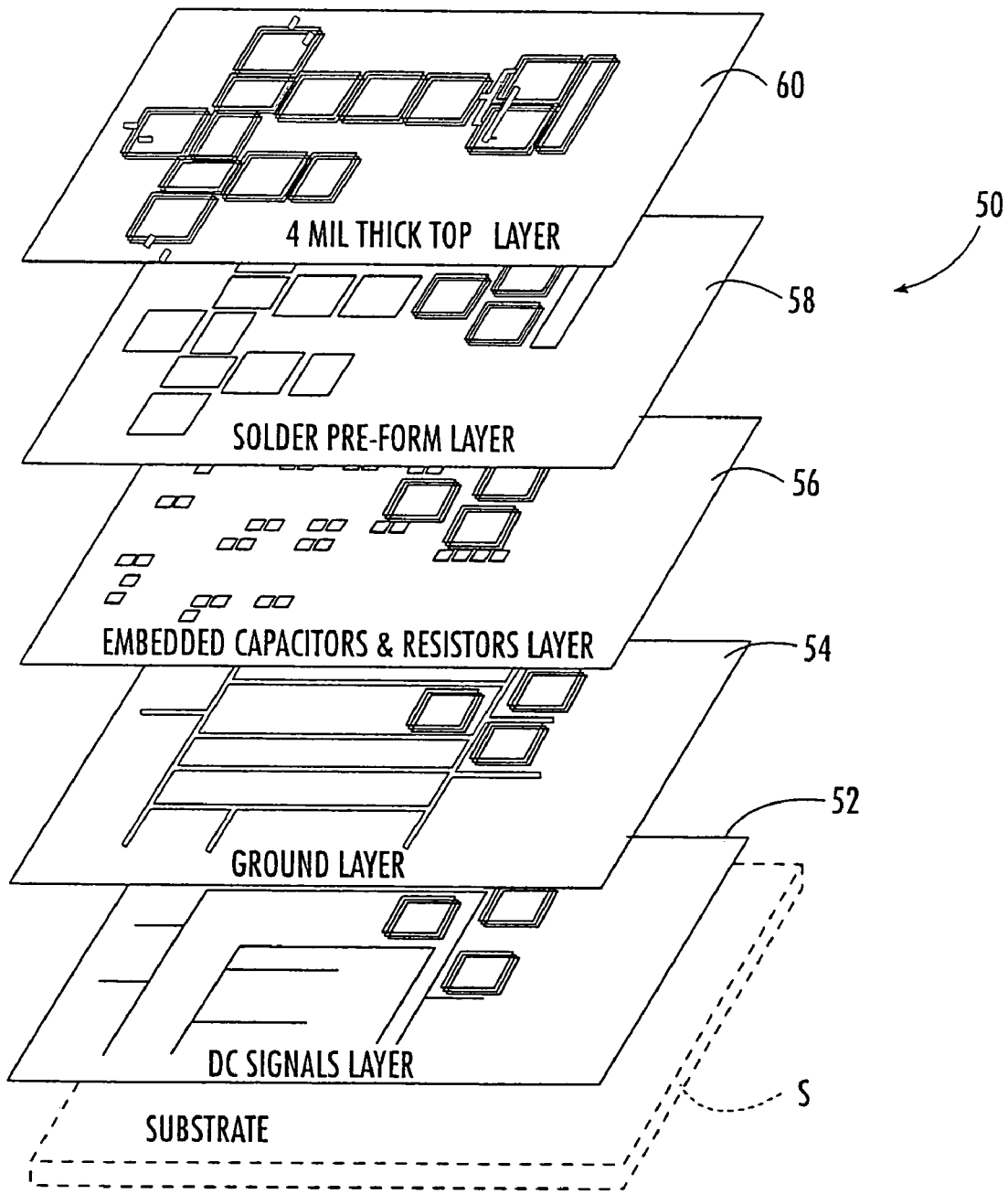
FIG. 4 is an exploded isometric view of the various layers of the thick film section.
Figure 5:
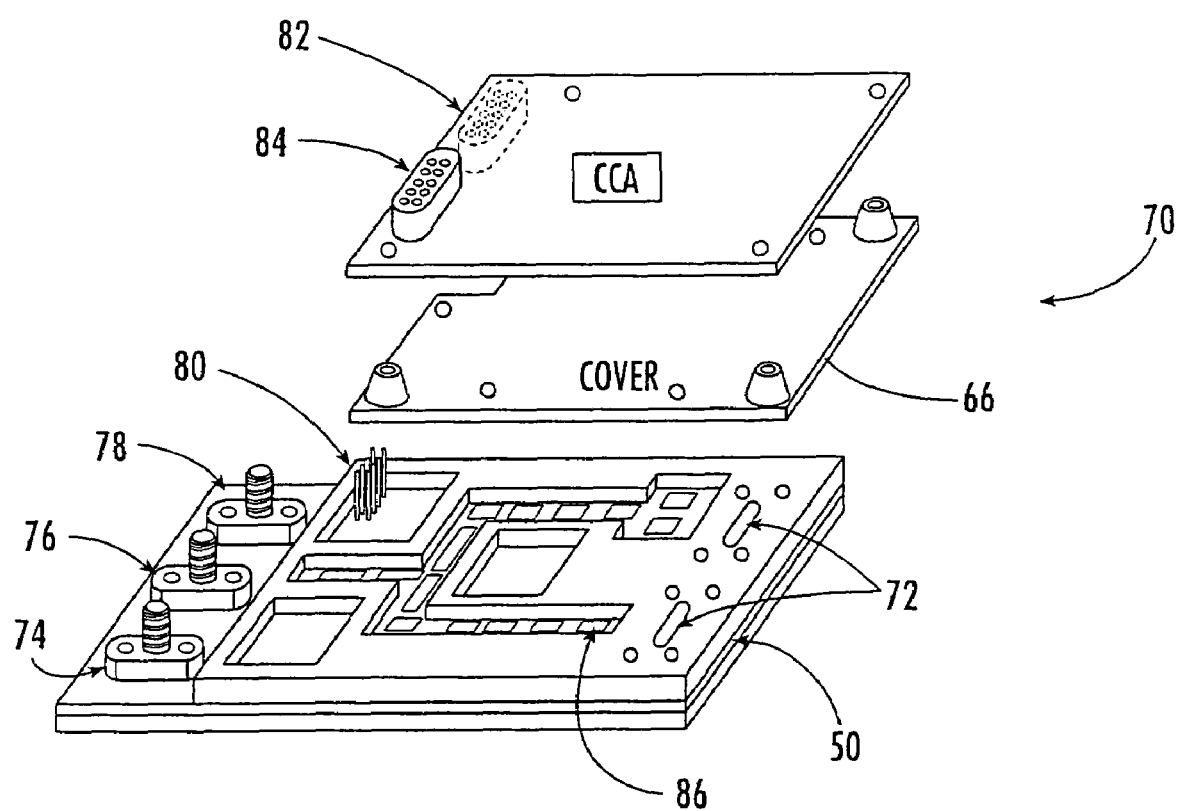
FIG. 5 is an exploded isometric view of a transceiver module, and showing the various connections.

FIGS. 3–5 illustrate an improved radio frequency transceiver module using thick film technology, such as the low temperature cofired ceramic technology known as green tape. More particularly, FIG. 4 illustrates a multilayer substrate board 50 having different layers of low temperature transfer tape technology (LTTT) sheets, including a DC signals layer 52, ground layer 54, embedded capacitors and resistors layer 56, solder preform layer 58 and top layer 60.

FIG. 3 illustrates how the different layers in FIG. 4 are combined to form a multilayer thick film substrate board 50 that is received on a base plate 62 with a channelization plate 64 and radio frequency cover 66. Isolation vias 67 are shown and illustrated. These vias can run across multiple layers down to the ground layer. They can be formed by techniques known to those skilled in the art.

FIG. 5 shows a MMIC transceiver module 70 with the waveguide interface 72 built into the channelization plate 64 and showing the intermediate frequency outputs 74, local oscillator input 76, intermediate frequency input 78, various DC pins 80, module connectors 82 and external connectors 84 on a CCA.

The present invention improves the MMIC module assembly process by using a low cost multilayer transfer tape thick film board 50 for attaching the MMIC chips 86 and embedding all the peripherals and electrical connections in the multilayer thick film. The present invention offer several benefits.

1. A new use of Low Temperature Transfer Tape Technology (LTTT) multi-layer board for MMW module design and fabrication.
2. Simplification of MMIC module assembly by reducing part count by a factor of five.
3. Reducing peripheral components count by embedding all resistors and capacitors in a multilayer thick film board.
4. Embedding electrical connections in the multi-layer board, there by reducing the number of wire and ribbon bonds.
5. Using a planar module configuration for ease of assembly, then attaching RF channelization after dies assembly.
6. Improving RF isolation through channelization, compartmentalization and ground vias.
7. Reducing housing cost by using wire-EDM method for channelization, instead of machining.
8. Directly attaching the SMA and K-connectors directly to the multilayer substrate board.

MMIC module production is made similar to surface mount technology by packaging the MMIC modules to allow complete automation of the assembly process. As shown in FIG. 3, the module is made up of the base plate 62, multilayer alumina substrate 50 formed from the layers, a channelization plate 64 and a cover 66.

The base plate 62 is a gold plated flat sheet of low cost CTE matched material, such as Cooper Tungsten (CuW), about ⅛ inch thick, in one aspect of the invention. The plate is only cut to size and requires no machining.

The multilayer substrate board 50 is fabricated using the Low Temperature Transfer Tape (LTTT) technology, such as similar to the green tape technology, as well known to those skilled in the art, similar to low temperature cofired ceramic (LTCC) sheets. The LTTT processing closely follows the steps used in well established multi-layer thick film processing, as known to those skilled in the art. The multiple dielectric printing per layer is replaced by a tape lamination step. Both gold and silver conductor systems can be used with LTTT. Interconnects and vias are formed by techniques known to those skilled in the art.

Although the LTTT process for forming multilayer structures can be applied to a wide variety of dielectric materials and substrate, the material selected for this illustrated aspect of the present invention is a standard 96% alumina substrate. The special formulated conductor materials are screen printed on the alumina substrate, using standard thick film equipment and processing techniques developed for forming conductive interconnects and interlayer vias. The tape sheets are bonded to the substrate using a combination of heat and pressure.

FIG. 4 show an example of the type of layers that can be used to form the alumina board. The number of layers can be as high as 12. The layers could be formed on a base substrate (S), as illustrated, of the type known to those skilled in the art. Each layer is about 2 to about 4 mil thick, and typically about 3 mil thick, and can be used to carry low frequency RF signals, DC signals, ground, or embedded passive components, such as capacitors and resistors. Interconnect or ground vias can be implemented across one or more layers of LTTT film.

This multilayer LTTT alumina substrate is particularly attractive for use with GaAs chip because of its CTE coefficient (7.1). Also, this material has excellent thermal conduction (25–200 W/MK). The MMIC GaAs chips can be attached directly to the substrate using gold tin solder pre-forms or silver epoxy. In cases of thermal concerns, the chips may be attached directly to the base plate using CTE matched shims, or on top of thermal vias that are connected to the bottom surface. These vias can be formed by techniques known to those skilled in the art. For ease of assembly and wire bonding, the top layer (3 to 4 mil thick) will have cut-outs made exactly to the size of the chips (see FIG. 5).

The multilayer substrate costs on the average about $1.5 to $2.5 per layer per square inch. Up to 275 vias per square inch are possible.

The channelization plate 64, in one aspect of the present invention, is formed of gold plated aluminum, although other materials could be used. The channels 64a are cut out using wire EDM methods. The channels 64a are created to provide the isolation required between the transmit and receiver signals and to generate a cut off to lower frequency signals. The RF cover is also made of gold plated aluminum.

FIG. 5 illustrates a MMW transceiver module including the surface mount circuit card assembly (CCA) used to provide the regulator/controller function. The SMA connectors are attached directly to the multilayer substrate. The RF interface waveguide is provided as part of the channelization plate.

The module shown in FIG. 5 can be assembled by the following technique as one non-limiting example.

1. Pick and place all the MMIC chips on to the multi-layer alumina substrate. The substrate should have all the low frequency signals connections, DC connections, ground connections, passive devices already embedded in the layers and the solder pre-form.

2. Pick and place the DC connector and the low frequency SMA connectors used for IF and LO signals.

3. Flow the solder in a vacuum oven to attached the MMIC die and the connectors to the substrate board. Silver epoxy may be used in place of the solder.

4. Wire/wedge bond the MMIC chips to the substrate board.

5. Attach the substrate board to the base plate and the channelization plate using epoxy.

6. Install RF cover.

7. Install the regulator/controller surface mount CCA.

This application is related to copending patent applications entitled, "MICROWAVE MONOLITHIC INTEGRATED CIRCUIT PACKAGE," and "SELF-TUNED MILLIMETER WAVE RF TRANSCEIVER MODULE," which are filed on the same date and by the same assignee and inventors, the disclosures which are hereby incorporated by reference.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

That which is claimed is:

1. A thick film millimeter wave transceiver module comprising:
   a base plate;
   a multi-layer, thick film substrate board formed from a plurality of planar sheets of low temperature, co-fired ceramic material stacked and bonded together without intermediate conductive sheet layers so as to constitute a single, planar substrate board having one planar bottom surface and one planar top surface, said substrate board comprising:
   a DC signals layer formed from a separate sheet and having embedded DC signal tracks and connections,
   a ground layer formed from a separate sheet and having ground connections,
   a device layer positioned over said ground layer and formed from a separate sheet and having capacitors and resistors embedded therein,
   a plurality of MMIC chips mounted on the top surface and operable to transmit and receive millimeter wavelength signals and connected to capacitors and resistors in the device layer; and
   a channelization plate received over the top surface of the substrate board and having channels formed to receive the MMIC chips and provide air isolation between any transmit and receive signals.

2. A thick film millimeter wave transceiver module according to claim 1, and further comprising a radio frequency cover received over said channelization plate.

3. A thick film millimeter wave transceiver module according to claim 1, and further comprising at least one of isolation, interconnect or ground vias which extend through at least two layers.

4. A thick film millimeter wave transceiver module according to claim 3, wherein said vias extend through the device layer to the ground layer.

5. A thick film millimeter wave transceiver module according to claim 1, wherein said MMIC chips are mounted using solder, conductive adhesive or shims.

6. A thick film millimeter wave transceiver module according to claim 1, wherein said ground layer is positioned over said DC signals layer.

7. A thick film millimeter wave transceiver module according to claim 1, and further comprising a base plate on which the planar substrate board is supported.

8. A thick film millimeter wave transceiver module according to claim 1, wherein each of the planar sheets is about 2 to about 4 mils thick.

9. A multi-layer thick film substrate board used in millimeter wave transceiver modules comprising:
   a plurality of planar sheets of low temperature, co-fired ceramic material stacked and bonded together without intermediate conductive sheet layers so as to constitute a single, planar substrate board having one planar bottom surface and one planar top surface on which a plurality of MMIC chips can be mounted and operable to transmit and receive millimeter wavelength signals, and further comprising,
   a DC signals layer formed from a separate sheet and having embedded DC signal tracks and connections,
   a ground layer formed from a separate sheet having ground connections, and
   a device layer positioned over said ground layer and formed from a separate sheet having capacitors and resistors embedded therein that connect to MMIC chips.

10. A multi-layer thick film substrate board according to claim 9, and further comprising at least one of isolation, interconnect or ground vias which extend through at least two layers.

11. A multi-layer thick film substrate board according to claim 10, wherein said vias extend through the device layer to the ground layer.

12. A multi-layer thick film substrate board according to claim 9, and further comprising MMIC chips mounted using solder, conductive adhesive or shims.

13. A multi-layer thick film substrate board according to claim 9, wherein said ground layer is positioned over said DC signals layer.

14. A multi-layer thick film substrate board according to claim 9, wherein each of planar sheets within said multi-layer substrate board is about 2 to about 4 mils thick.

15. A method of forming a thick film substrate board used for millimeter wave transceiver modules which comprises:
   stacking and bonding together a plurality of planar sheets of low temperature co-fired ceramic material stacked without intermediate conductive sheet layers to form a substantially planar board having one planar bottom surface and one planar top surface, wherein the board includes a DC signals layer formed from a separate sheet and having embedded DC signal tracks and connections, a ground layer formed from a separate sheet having ground connections, and a device layer formed over the ground layer from a separate sheet having capacitors and resistors embedded therein that connect to MMIC chips; and
   mounting at least one MMIC chip onto the top surface of the board such that the at least one MMIC chip operatively connects to selected components within at least one layer via interconnects for transmitting and receiving millimeter wavelength RF signals.

16. A method according to claim 15, which further comprises forming the ground layer over the DC signals layer.

17. A method according to claim 15, which further comprises forming at least one of isolation, interconnect or ground vias which extend through at least two layers.

18. A method according to claim 17, which further comprises forming the vias to extend through the device layer to the ground layer.

19. A method according to claim 15, which further comprises mounting the MMIC chips using solder, conductive adhesive or shims.

20. A method according to claim 15, which further comprises forming each of the planar sheets within the multilayer substrate board about 2 to about 4 mils thick.

* * * * *